United States Patent [19]

Prakash et al.

[11] Patent Number: 5,619,435
[45] Date of Patent: Apr. 8, 1997

[54] METHOD AND APPARATUS FOR SIMULATING THE BEHAVIOR AND OPERATION OF A THREE-PHASE INDUCTION MACHINE

[75] Inventors: Rajiva Prakash, Westland; Marc R. Davis, Dearborn; Christos A. Kambouris, Northville, all of Mich.

[73] Assignee: Ford Motor Company, Dearborn, Mich.

[21] Appl. No.: 558,950

[22] Filed: Nov. 13, 1995

Related U.S. Application Data

[63] Continuation of Ser. No. 43,675, Apr. 7, 1993, abandoned.

[51] Int. Cl.$^6$ .................................................. H02P 5/40
[52] U.S. Cl. .......................... 364/578; 364/802; 318/800
[58] Field of Search .................................. 364/578, 802, 364/480, 481; 318/800, 805, 807, 808

[56] References Cited

U.S. PATENT DOCUMENTS

| | | | |
|---|---|---|---|
| 3,723,718 | 3/1973 | Jaffe et al. | 235/185 |
| 4,293,916 | 10/1981 | Del Re et al. | 364/578 |
| 4,293,923 | 10/1981 | Jasmin et al. | 235/185 |
| 4,585,985 | 4/1986 | Bose | 318/807 |
| 4,677,587 | 6/1987 | Zemany, Jr. | 364/578 |
| 4,680,959 | 7/1987 | Henry et al. | 364/578 |
| 4,777,422 | 10/1988 | Slicker et al. | 318/800 |
| 4,926,105 | 5/1990 | Mischenko et al. | 318/800 |
| 4,935,886 | 6/1990 | Choka | 364/578 |
| 4,945,508 | 7/1990 | Benejean | 364/802 |
| 4,958,116 | 9/1990 | Hirose | 318/800 |

Primary Examiner—Edward R. Cosimano
Assistant Examiner—Eric W. Stamber
Attorney, Agent, or Firm—Mark S. Sparschu; Roger L. May

[57] ABSTRACT

Provided is a method and apparatus for simulating the behavior and operation of a three-phase induction machine. The present invention provides for a digital simulating device for simulating the behavior and operation of three-phase induction machines in accordance with selected parameters. There is further provided a computer modeling method for behavioral and operational analysis which utilizes blocks and super-blocks connected with signals as in physical systems. The modeling method incorporates an algebraicly simplified set of equations in stationary 2-axes reference frame.

9 Claims, 10 Drawing Sheets fig-1 fig-2 fig-3

STATOR TRANSLATION fig-12 fig-5 fig-6 fig-7 fig-8 fig-9

Fig-10 fig-11

ROTOR TRANSLATION fig-13 fig-14

METHOD AND APPARATUS FOR SIMULATING THE BEHAVIOR AND OPERATION OF A THREE-PHASE INDUCTION MACHINE

This is a continuation of application Ser. No. 08/043,675, filed on Apr. 7, 1993 now abondoned.

TECHNICAL FIELD

The present invention relates generally to the simulation of electric machines and, more particularly, to a method and apparatus for off-line computer simulation and real-time digital simulation of a three-phase induction machine.

BACKGROUND OF THE INVENTION

The modeling and simulation of electric machines is highly desirable for numerous reasons, including evaluation of machine behavior in open-loop operation, analysis of complex drive systems which incorporate such machinery and the design of applicable feedback controllers and control algorithms. Off-line and real-time simulations are particularly useful in the evaluation of induction machines which, because of their rugged design, are often used in industrial applications and may be interfaced with physical signals, systems and subsystems.

Historically, system designers have directed their modeling efforts to analog simulations of synchronous machines. See for example, U.S. Pat. Nos. 4,945,508, 4,293,923 and 3,723,718 issued to Benejean, Jasmin et al. and Jaffe et al, respectively, each of which uses the modeling approach of analog simulation wherein complex analog circuitry, e.g., oscillators, a plurality of multipliers, phase-locked loop circuits, and various op amp based circuits are employed in the simulating device. As those skilled in the art will recognize, these prior art devices have proven difficult and expensive to build and are generally inflexible to adapt to machines of different ratings and parameters. They are also highly unreliable due to the large number of electronic components used and are relatively limited in ranges and modes of operation due to the inherent possibilities of saturation of op-amps.

Against this background, those skilled in the art will further recognize that even beyond these limitations, the prior art modeling approaches are generally inapplicable to induction machines because of the fundamental differences in the design, operation and behavior between synchronous and induction machines. For example, synchronous machines are known to have explicit field windings carrying DC current and damper windings on the rotor. Induction machines have no corresponding windings. Similarly, synchronous machines rotate at zero slip or "synchronous" speed. In contrast, induction machines always have non-zero slip. Thus, the mathematical model governing synchronous machines have terms relating to field current and induced current in damper windings, while the equations of induction machines have terms dependent on slip or slip speed.

These and other differences known to those skilled in the art render historical modeling approaches of the type referenced in the prior art inapplicable to induction machines.

DISCLOSURE OF THE INVENTION

The present invention overcomes the shortcomings of the prior art modeling approaches by providing a method and apparatus for off-line and real-time simulation of three phase induction machines. The off-line block diagram approach disclosed herein consists of blocks and super-blocks connected with signals as in physical systems. By "super-blocks", applicants refer to a group of blocks connected together performing selected tasks. These super-blocks may be connected by the user "on-screen" for simulation based on various inputs and load conditions. In this manner, complex machine equations may be easily solved without resorting to the use of high level language computer programs as was customary in prior art approaches. A digital simulating device which uses a digital signal processor (DSP) chip, with a floating point calculation capability, is also provided for real-time simulation.

It is therefore a general object of the present invention to provide a computer technique for simulating the behavior and operation of a three-phase induction machine which is valid for any three-phase voltage inputs and load torque. Specifically, the present invention provides for a computer modeling approach applicable to induction machines which uses blocks and super-blocks connected with signals as in physical systems. The super-blocks may be connected by the user "on-screen" for simulation based on various inputs and loads.

Another more specific object of the present invention is the provision of a DSP based modeling apparatus for simulating the behavior and operation of three-phase induction machine in accordance with selected input parameters.

Yet another more specific object of the present invention is the provision of an off-line method for modeling the behavior and operation of a three-phase induction machine which incorporates an algebraically simplified set of equations in stationary 2-axes reference frame.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 10 is a simplified circuit schematic of the DSP based simulating apparatus of the present invention shown in FIG. 2.

BEST MODE FOR CARRYING OUT THE INVENTION

A. Input/Output Description of the Models

Figure 1:
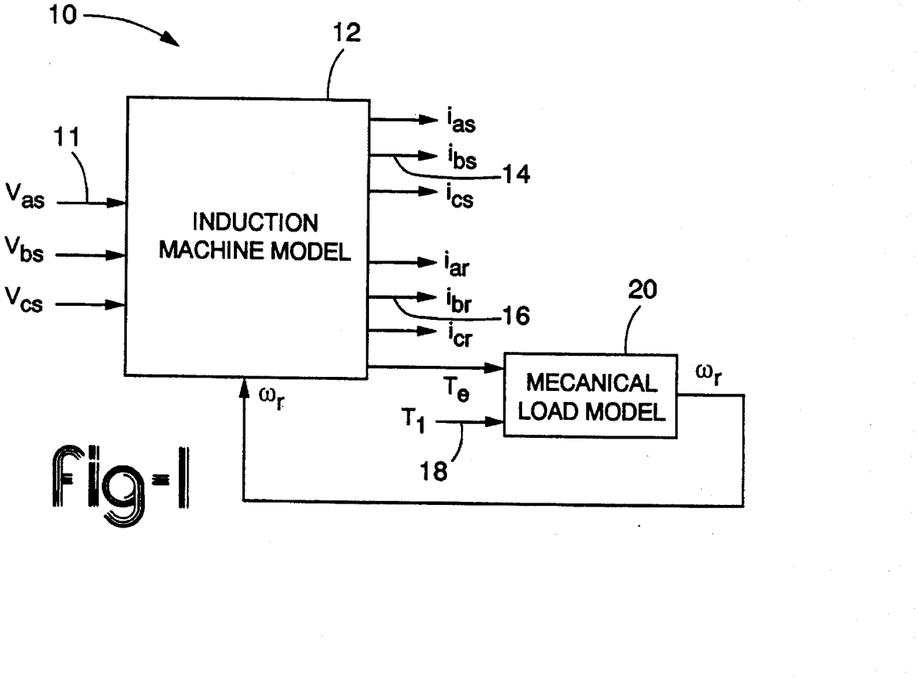
FIG. 1 is a general schematic block diagram of the induction machine model of the present invention showing inputs and outputs.

With reference to FIG. 1 of the drawings, there is shown a basic input/output block diagram schematic of the off-line computer simulation method of the present invention designated generally by reference numeral 10. As disclosed herein, the objectives of the modeling approach of the present invention are: (1) to evaluate and develop control algorithms necessary in electric and hybrid electric vehicles; and (2) to provide assistance in decision-making related to design/hardware issues.

As shown in FIG. 1, the three-phase voltages $v_{as}$, $v_{bs}$, and $v_{cs}$, designated by reference numeral 11 are supplied as inputs to the induction machine model 12. Similarly, the three-phase stator currents 14 ($i_{as}$, $i_{bs}$, and $i_{cs}$), three-phase rotor currents 16 ($i_{ar}$, $i_{br}$ and $i_{cr}$) and torque ($T_e$) are provided as the outputs. Significantly, these voltages and currents are the actual values. As those skilled in the art will recognize, all of the rotor parameters and variables disclosed herein are referred to stator in accordance with common practice. Thus, rotor resistance, leakage inductance, self-inductance, voltage, flux and current are all referred to stator.

It should be noted that the speed of the machine, $\omega_r$, appears throughout the machine equations provided herein. This speed, however, depends on the mechanical load and the generated torque, $T_e$. Thus, a model of the mechanical load which includes the moment of inertia and friction of the rotor of the induction machine are inevitable. As seen in FIG. 1, the torque generated by the machine is the input to the mechanical load model 20 and also load torque 18 ($T_l$) is specified. The mechanical speed, $\omega_r$, is the output of this model which is provided as feedback to the machine model 10.

Before proceeding, the following glossary of notations and symbols should be understood as they correspond to the equations referenced herein:

| | |
|---|---|
| $V_{abcs}$ | Input phase voltages (Volts) |
| $i_{abcs}$ | Stator Currents (Amp) |
| $i_{abcr}$ | Rotor Currents (Amp) |
| $T_e$ | Generated Torque (N-m) |
| $T_l$ | Load Torque (N-m) |
| $\omega$ | Speed of the rotation of d-q axes (rad/s) |
| $\omega_r$ | Motor Speed (elec. rad/s) |
| v | Voltage |
| i | Current |
| $\lambda$ | Flux linkage |
| Sub "ds" | Stator quantity in d-axis |
| Sub "qs" | Stator quantity in q-axis |
| Sub "os" | Stator quantity in o-axis |
| Sub "dr" | Rotor quantity in d-axis |
| Sub "qr" | Rotor quantity in q-axis |
| Sub "or" | Rotor quantity in o-axis |
| Sub "xs" | Stator quantity in x-axis |
| Sub "ys" | Stator quality in y-axis |
| Sub "xr" | Rotor quality in x-axis |
| Sub "yr" | Rotor quality in y-axis |
| r | Resistance |
| L | Inductance |
| M | Magnetizing inductance |
| Sub "s" | Stator parameter |
| Sub "r" | Rotor parameter |
| Sub "l" | Leakage |
| P | Number of poles |
| J | Moment of inertia of motor and load |
| b | Viscous friction coeff. of motor and load |
| p | Derivative operator. |

Figure 11:
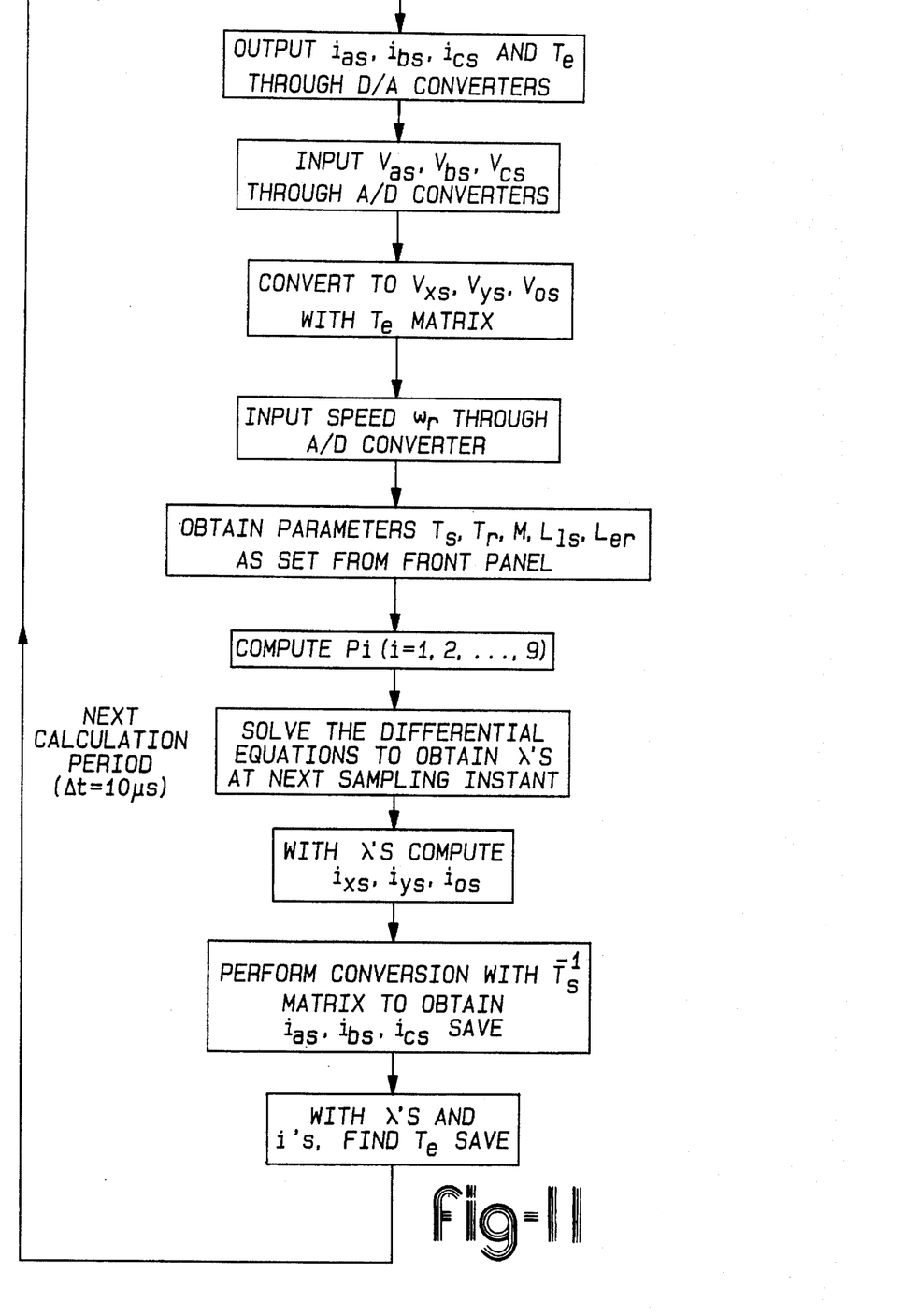
FIG. 11 is a flow chart of the method steps for the software of the simulating apparatus of the present invention.

In the illustrated embodiment, the model of FIG. 11 is based on machine equations in a stationary x-y frame.

B. Translations To And From Two-Axes System

1. Arbitrary Rotating d-q Axes

Figure 12:
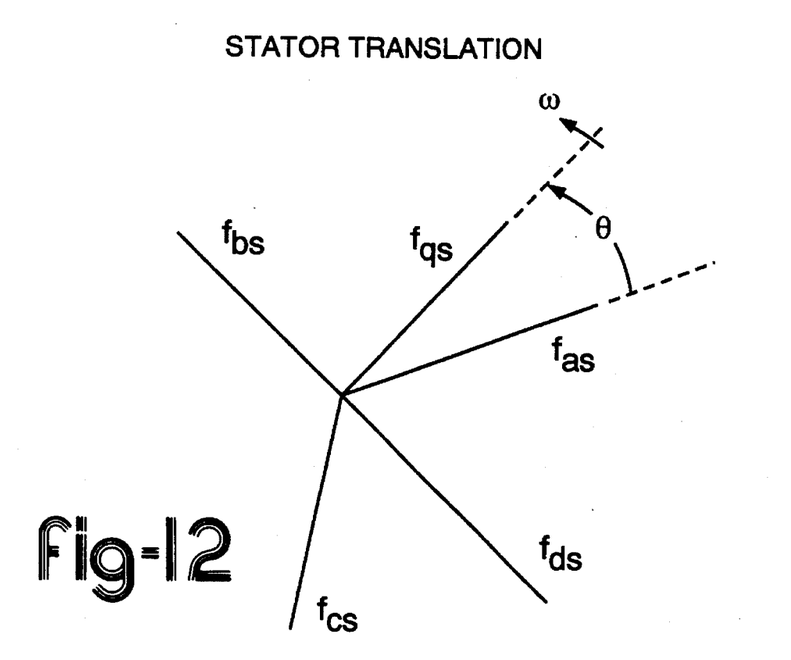
FIG. 12 is a vector diagram illustrating stator translation.

Those skilled in the art will recall that the transformation from a-b-c (machine) variables to and from d-q-o variables may be accomplished through the use of known transformation matrices. Referring now to FIG. 12 there is shown a vector diagram illustrating the translation of stator a-b-c variables. As referenced below, the matrix for transformation from stator a-b-c variables to d-q-o variables (and vice versa) is denoted $K_s$ ($K_s^{-1}$).

Figure 13:
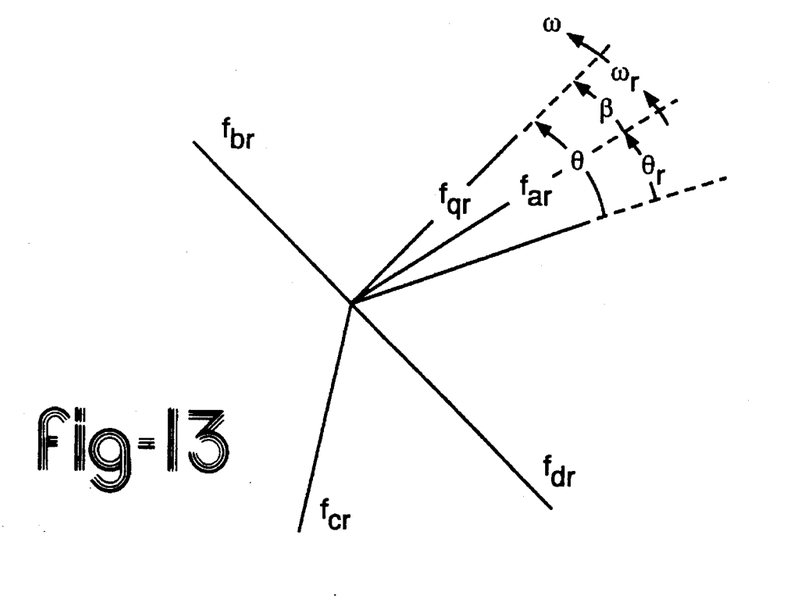
FIG. 13 is a vector diagram illustrating rotor translation.

Similarly, the matrix for transformation from rotor a-b-c variables to d-q-o variables (and vice versa) is denoted $K_r(K_r^{-1})$. Referring now to FIG. 13 there is shown the translation of rotor a,b,c. variables. The matrices are provided below for general background purposes and may also be found in B. K. Bose, "Power Electronics And AC Drives," Prentice Hall, Englewood Cliffs, N.J., 1986.

$$f = v \text{ or } i$$

$$f_{abcs} = \begin{bmatrix} f_{as} \\ f_{bs} \\ f_{cs} \end{bmatrix} \quad f_{qdos} = \begin{bmatrix} f_{qs} \\ f_{ds} \\ f_{os} \end{bmatrix}$$

$$f_{qdos} = k_s f_{abcs}$$

$$\theta(t) = \int_0^t w(\xi) \, d\xi + \theta(\phi)$$

$$k_s = \frac{2}{3} \begin{bmatrix} \cos\theta & \cos\left(\theta - \frac{2\pi}{3}\right) & \cos\left(\theta + \frac{2\pi}{3}\right) \\ \sin\theta & \sin\left(\theta - \frac{2\pi}{3}\right) & \sin\left(\theta + \frac{2\pi}{3}\right) \\ \frac{1}{2} & \frac{1}{2} & \frac{1}{2} \end{bmatrix}$$

$$f_{abcs} = k_s^{-1} f_{qdos}$$

$$(k_s)^{-1} = \begin{bmatrix} \cos\theta & \sin\theta & 1 \\ \cos\left(\theta - \frac{2\pi}{3}\right) & \sin\left(\theta - \frac{2\pi}{3}\right) & 1 \\ \cos\left(\theta + \frac{2\pi}{3}\right) & \sin\left(\theta + \frac{2\pi}{3}\right) & 1 \end{bmatrix}$$

$$f = v \text{ or } i$$

$$f_{abcr} = \begin{bmatrix} f_{ar} \\ f_{br} \\ f_{cr} \end{bmatrix} \quad f_{qdor} = \begin{bmatrix} f_{qr} \\ f_{dr} \\ f_{or} \end{bmatrix}$$

$$f_{qdor} = k_r f_{abcr}$$

$$\theta_r(t) = \int_0^t w_r(\xi) \, d\xi + \theta_r(\phi)$$

$$\beta(t) = \theta(t) - \theta_r(t)$$

$$k_r = \frac{2}{3} \begin{bmatrix} \cos\beta & \cos\left(\beta - \frac{2\pi}{3}\right) & \cos\left(\beta + \frac{2\pi}{3}\right) \\ \sin\beta & \sin\left(\beta - \frac{2\pi}{3}\right) & \sin\left(\beta + \frac{2\pi}{3}\right) \\ \frac{1}{2} & \frac{1}{2} & \frac{1}{2} \end{bmatrix}$$

$$f_{abcr} = (k_r)^{-1} f_{qdor}$$

$$(k_r)^{-1} = \begin{bmatrix} \cos\beta & \sin\beta & 1 \\ \cos\left(\beta - \frac{2\pi}{3}\right) & \sin\left(\beta - \frac{2\pi}{3}\right) & 1 \\ \cos\left(\beta + \frac{2\pi}{3}\right) & \sin\left(\beta + \frac{2\pi}{3}\right) & 1 \end{bmatrix}$$

It should be noted that $\theta(\emptyset)$ which depends on the initial position of the d-q axis is taken as $90°(\pi/2$ radians) in the preferred embodiment of the invention. With $\theta(\emptyset)=\pi/2$, the d-axis ($f_{ds}$, and $f_{dr}$ vectors) and the q-axis ($f_{qs}$, and $f_{qr}$ vectors) are, respectively, horizontal and vertical at time zero.

2. Stationary Axes (x-y Axes)

Figure 14:
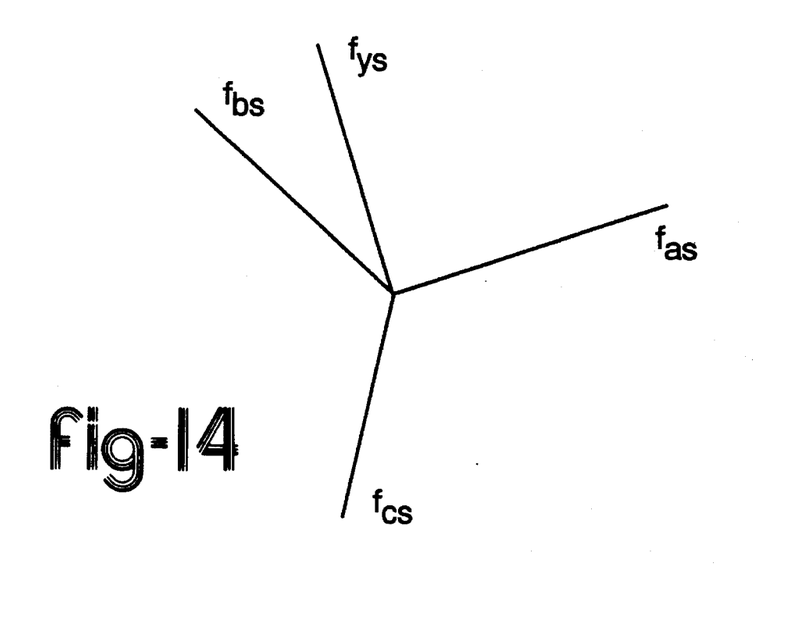
FIG. 14 is a vector diagram illustrating translation associated with stationary axes.

When the d-q axes are assumed to be stationary ($\omega=\emptyset$), some simplifications occur in the transformation matrices. These stationary pair of axis will be referred to as x-y axes. Assuming $\theta(\emptyset)=\pi/2$ in the orientation of axes as referenced above and designating "d" and "q" axes as "x" and "y" axes, respectively, the new axes and new matrices of transformation are as provided below. It should be noted that in the names of matrices, "k" has been replaced by "T" for the sake of uniqueness. FIG. 14 illustrates the translation of a-b-c- variables where the d-q axes are soon to be stationary.

$$f_{xyos} = [f_{xs}\, f_{ys}\, f_{os}]$$

$$f_{xyos} = T_s f_{abcs}$$

$$T_s = \begin{bmatrix} \frac{2}{3} & \frac{-1}{3} & \frac{-1}{3} \\ 0 & \frac{1}{\sqrt{3}} & \frac{-1}{\sqrt{3}} \\ \frac{1}{3} & \frac{1}{3} & \frac{1}{3} \end{bmatrix}$$

$$f_{abcs} = T_s^{-1} f_{xyos}$$

$$T_s^{-1} = \begin{bmatrix} 1 & 0 & 1 \\ -\frac{1}{2} & \frac{\sqrt{3}}{2} & 1 \\ -\frac{1}{2} & -\frac{\sqrt{3}}{2} & 1 \end{bmatrix}$$

$$f_{xyor} = \begin{bmatrix} f_{xr} \\ f_{yr} \\ f_{or} \end{bmatrix}$$

$$f_{xyor} = T_r f_{abcr}$$

$$T_r = \frac{2}{3} \begin{bmatrix} \sin\beta & \sin\left(\beta - \frac{2\pi}{3}\right) & \sin\left(\beta + \frac{2\pi}{3}\right) \\ \cos\beta & \cos\left(\beta - \frac{2\pi}{3}\right) & \cos\left(\beta + \frac{2\pi}{3}\right) \\ \frac{1}{2} & \frac{1}{2} & \frac{1}{2} \end{bmatrix}$$

where $$\beta = \frac{\pi}{2} - \theta_r(t)$$

$$f_{abcr} = T_r^{-1} f_{xyor}$$

$$T_r^{-1} = \begin{bmatrix} \sin\beta & \cos\beta & 1 \\ \sin\left(\beta - \frac{2\pi}{3}\right) & \cos\left(\beta - \frac{2\pi}{3}\right) & 1 \\ \sin\left(\beta + \frac{2\pi}{3}\right) & \cos\left(\beta + \frac{2\pi}{3}\right) & 1 \end{bmatrix}$$

C. Mathematical Models

1. Machine Equations in Rotating d-q Axes

The induction machine equations in three-phase variables (voltages, fluxes and currents) are the most fundamental equations of the machine. These equations are too complex for simulation. The two-axes transformation referenced above may be applied to these equations to obtain the following standard equations in rotating d-q axes reference frame:

$$v_{qs}=r_s i_{qs}+\omega\lambda_{ds}+p\lambda_{qs}$$

$$v_{ds}=r_s i_{ds}-\omega\lambda_{qs}+p\lambda_{ds}$$

$$v_{os}=r_s i_{os}+p\lambda_{os}$$

$$v_{qr}=r_r i_{qr}+(\omega-\omega_r)\lambda_{dr}+p\lambda_{qr}$$

$$v_{dr}=r_r i_{dr}-(\omega-\omega_r)\lambda_{qr}+p\lambda_{dr}$$

$$v_{or}=r_r i_{or}+p\lambda_{or}$$

As referenced above, the equations may also be found in B. K. Bose, "Power Electronics And Drives," Prentice Hall, Englewood Cliffs, N.J., 1986.

Corresponding flux linkages in the above equations are:

$$\lambda_{qs}=L_{ls}i_{qs}+M(i_{qs}+i_{qr})$$

$$\lambda_{ds}=L_{ls}i_{ds}+M(i_{ds}+i_{dr})$$

$$\lambda_{os}=L_{ls}i_{os}$$

$$\lambda_{qr}=L_{lr}i_{qr}+M(i_{qs}+i_{qr})$$

$$\lambda_{dr}=L_{lr}i_{dr}+M(i_{ds}+i_{dr})$$

$$\lambda_{or}=L_{lr}i_{or}$$

The torque equation is:

$$T_e = \left(\frac{3}{2}\right)\left(\frac{P}{2}\right)(\lambda_{ds}i_{qs} - \lambda_{qs}i_{ds})$$

Substituting for $\lambda$'s from the algebraic equations into the dynamic equations yields dynamic equations with i's as state variables and two derivatives in each dynamic equation. In accordance with the invention herein, the above standard non-linear induction machine equations are thus manipulated so that flux linkages are the state variables rather than currents. This new set of equations is provided below:

$$p\lambda_{qs} = v_{qs} - \omega\lambda_{ds} + \frac{r_s}{L_{ls}}(\lambda_{mq} - \lambda_{qs})$$

$$p\lambda_{ds} = v_{ds} + \omega\lambda_{qs} + \frac{r_s}{L_{ls}}(\lambda_{md} - \lambda_{ds})$$

$$p\lambda_{os} = V_{os} - \frac{r_s}{L_{ls}}\lambda_{os}$$

$$p\lambda_{qr} = v_{qr} - (\omega - \omega_r)\lambda_{dr} + \frac{r_r}{L_{lr}}(\lambda_{mq} - \lambda_{qr})$$

$$p\lambda_{dr} = v_{dr} + (\omega - \omega_r)\lambda_{qr} + \frac{r_r}{L_{lr}}(\lambda_{md} - \lambda_{dr})$$

$$p\lambda_{or} = v_{or} - \frac{r_r}{L_{lr}}\lambda_{or}$$

where $$\lambda_{mq} = L_{aq}\left(\frac{\lambda_{qs}}{L_{ls}} + \frac{\lambda_{qr}}{L_{lr}}\right)$$

and $$\lambda_{md} = L_{ad}\left(\frac{\lambda_{ds}}{L_{ls}} + \frac{\lambda_{dr}}{L_{lr}}\right)$$

wherein

-continued $$L_{aq} = L_{ad} = \left( \frac{1}{M} + \frac{1}{L_{ls}} + \frac{1}{L_{lr}} \right)^{-1}$$

The currents are obtained from flux variables by the following algebraic equations:

$$i_{qs} = \frac{1}{L_{ls}} (\lambda_{qs} - \lambda_{mq})$$

$$i_{ds} = \frac{1}{L_{ls}} (\lambda_{ds} - \lambda_{md})$$

$$i_{os} = \frac{1}{L_{ls}} \lambda_{os}$$

$$i_{qr} = \frac{1}{L_{lr}} (\lambda_{qr} - \lambda_{mq})$$

$$i_{dr} = \frac{1}{L_{lr}} (\lambda_{dr} - \lambda_{md})$$

$$i_{or} = \frac{1}{L_{lr}} \lambda_{or}$$

The torque equation is:

$$T_e = \left( \frac{3}{2} \right) \left( \frac{P}{2} \right) (\lambda_{ds} i_{qs} - \lambda_{qs} i_{ds})$$

The above modified set of equations have a single derivative in each dynamic equation, in contrast with two in the standard equations. Moreover, the modified equations have flux variables as state variables which are known to vary more slowly than the currents which are state variables in the standard equations. Applicants have thus found that the modified equations have better numerical behavior and are easier to solve.

It should also be noted that in squirrel cage induction machines, there is no provision for voltage input into the rotor. Since these squirrel cage machines are more common, in keeping with the invention, applicants have removed the rotor-applied voltage from the equations. Accordingly, $v_{qr} = v_{dr} = v_{or} = 0$ in all the equations.

2. Machine Equations In Stationary x-y Axes

In accordance with the invention, applicants have found that the modified equations in rotating d-q frame may further be manipulated to yield a set of equations that are even simpler, i.e. have even fewer arithmetic operations. The new set of equations are in stationary two-axes frame and are provided below.

a. Dynamic Equations $$p\lambda_{xs} = v_{xs} + p_1 \lambda_{xs} + p_2 \lambda_{xr}$$

$$p\lambda_{ys} = v_{ys} + p_1 \lambda_{ys} + p_2 \lambda_{yr}$$

$$p\lambda_{os} = v_{os} - p_7 \lambda_{os}$$

$$p\lambda_{xr} = v_{xr} + p_3 \lambda_{xr} + p_4 \lambda_{xs} - \omega_r \lambda_{yr}$$

$$p\lambda_{yr} = v_{yr} + p_3 \lambda_{yr} + p_4 \lambda_{ys} + \omega_r \lambda_{xr}$$

$$p\lambda_{or} = v_{or} - p_8 \lambda_{or}$$

b. Algebraic Equations $$i_{xs} = p_5 \lambda_{xs} + p_6 \lambda_{xr}$$

$$i_{ys} = p_5 \lambda_{ys} + p_6 \lambda_{yr}$$

$$i_{os} = p_9 \lambda_{os}$$

$$i_{xr} = p_{10} \lambda_{xr} + p_6 \lambda_{xs}$$

$$i_{yr} = p_{10} \lambda_{yr} + p_6 \lambda_{ys}$$

$$i_{or} = p_{11} \lambda_{or}$$

$$T_e = \frac{3P}{4} (\lambda_{xs} i_{ys} - \lambda_{ys} i_{xs})$$

c. Definitions of Derived Machine Parameters $$P_1 \triangleq -r_s \phi L_r$$

$$P_2 \triangleq r_s \phi M$$

$$p_3 \triangleq -r_r \phi L_s$$

$$P_4 \triangleq r_r \phi M$$

$$p_5 \triangleq \phi L_r$$

$$p_6 \triangleq -\phi M$$

$$p_7 \triangleq \frac{r_s}{L_{ls}}$$

$$p_8 \triangleq \frac{r_r}{L_{lr}}$$

$$p_9 \triangleq \frac{1}{L_{ls}}$$

$$p_{10} \triangleq \phi L_s$$

$$p_{11} \triangleq \frac{1}{L_{lr}}$$

where $$\phi \triangleq \frac{1}{L_s L_r - M^2}$$

Significantly, the following observations can be made following review of the above equations:

(a) the $\omega$ variable does not appear since $\omega = \emptyset$ has been substituted;

(b) the "x" and "y" variables have been substituted for "d" (direct axis) and "q" (quadrature axis), respectively;

(c) $p_i$ (i=1,2, . . . ,9) are parameters that are functions of actual machine parameters (resistances and inductances); and (d) the arithmetic operations are very few in the total set of equations, assuming that $P_i$ (i=1,2, . . . ,9) have already been calculated.

These equations will be used for both off-line modeling and in the disclosed real-time simulator device.

D. Computer Simulation Models In Block-Diagram Form

Figure 3:
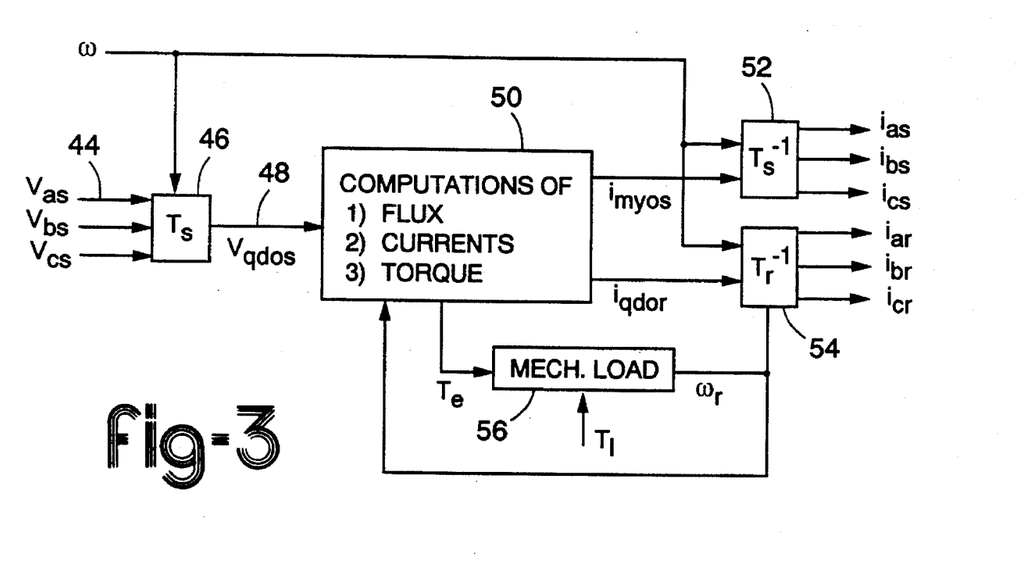
FIG. 3 is a top level schematic block diagram of a preferred embodiment of the induction machine simulation of the present invention.
Figure 4:
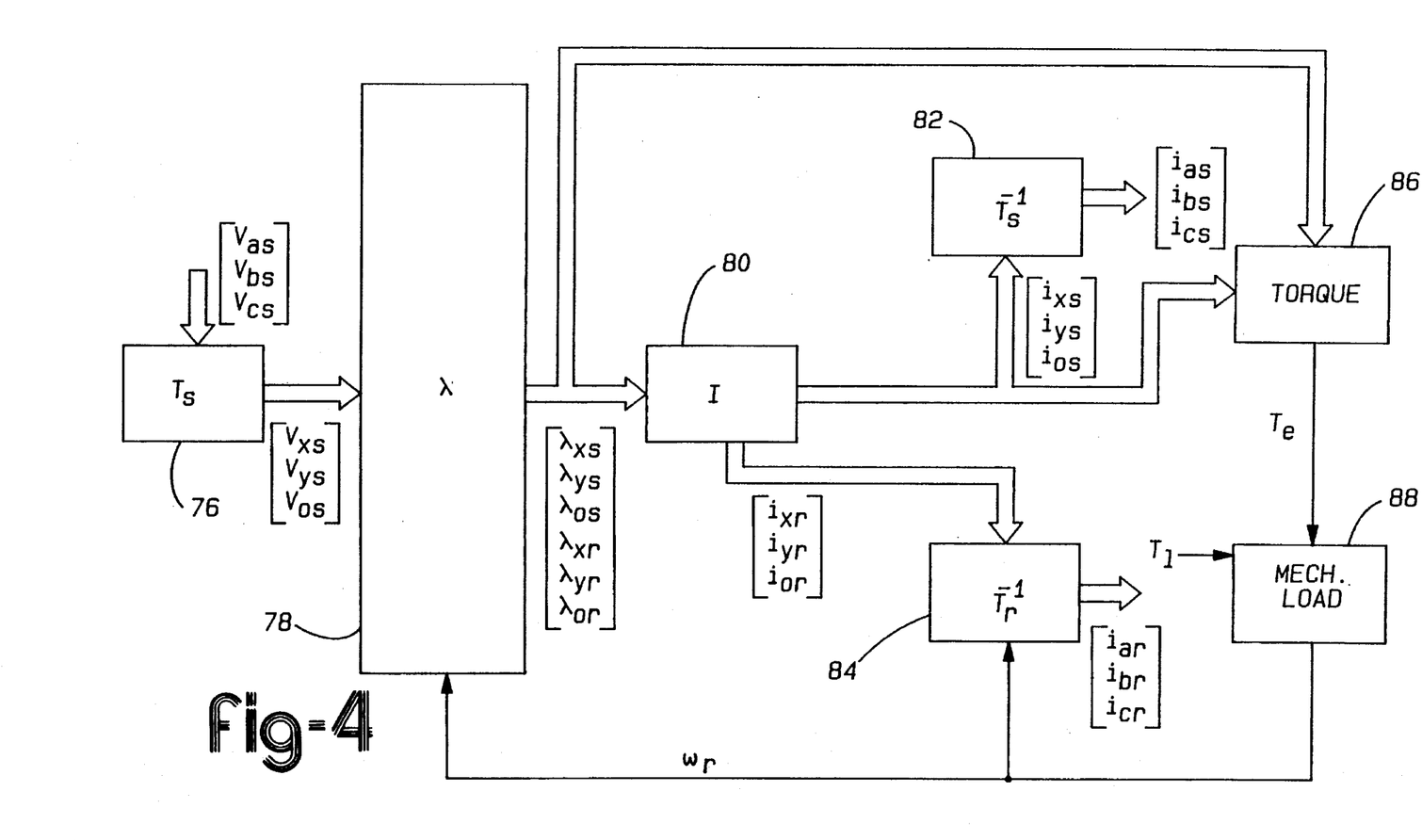
FIG. 4 is a general block diagram with the "super-blocks" for the induction machine simulation of the present invention.
Figure 5:
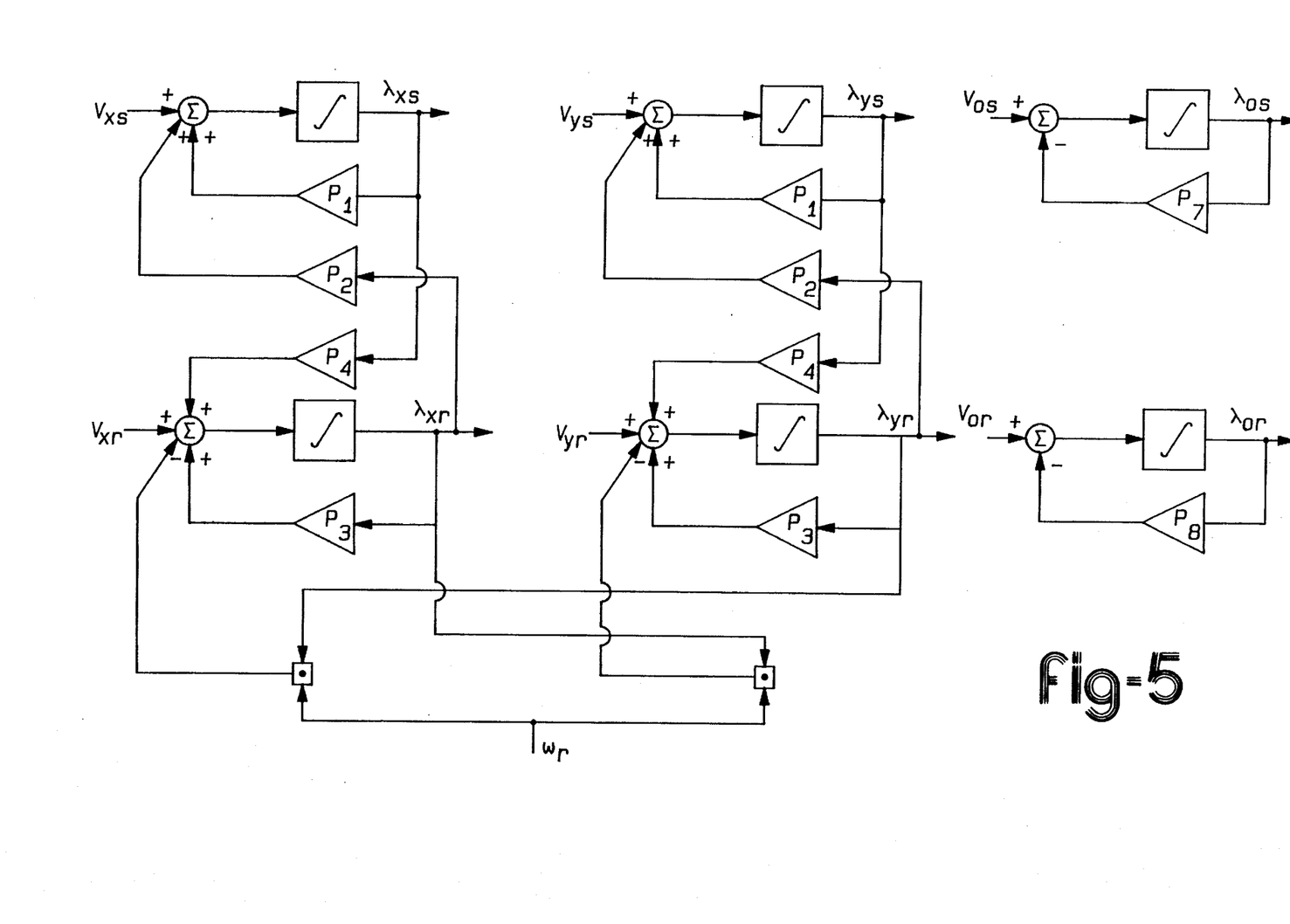
FIGS. 5–9 are detailed block diagrams of the super-blocks of FIG. 4.
Figure 6:
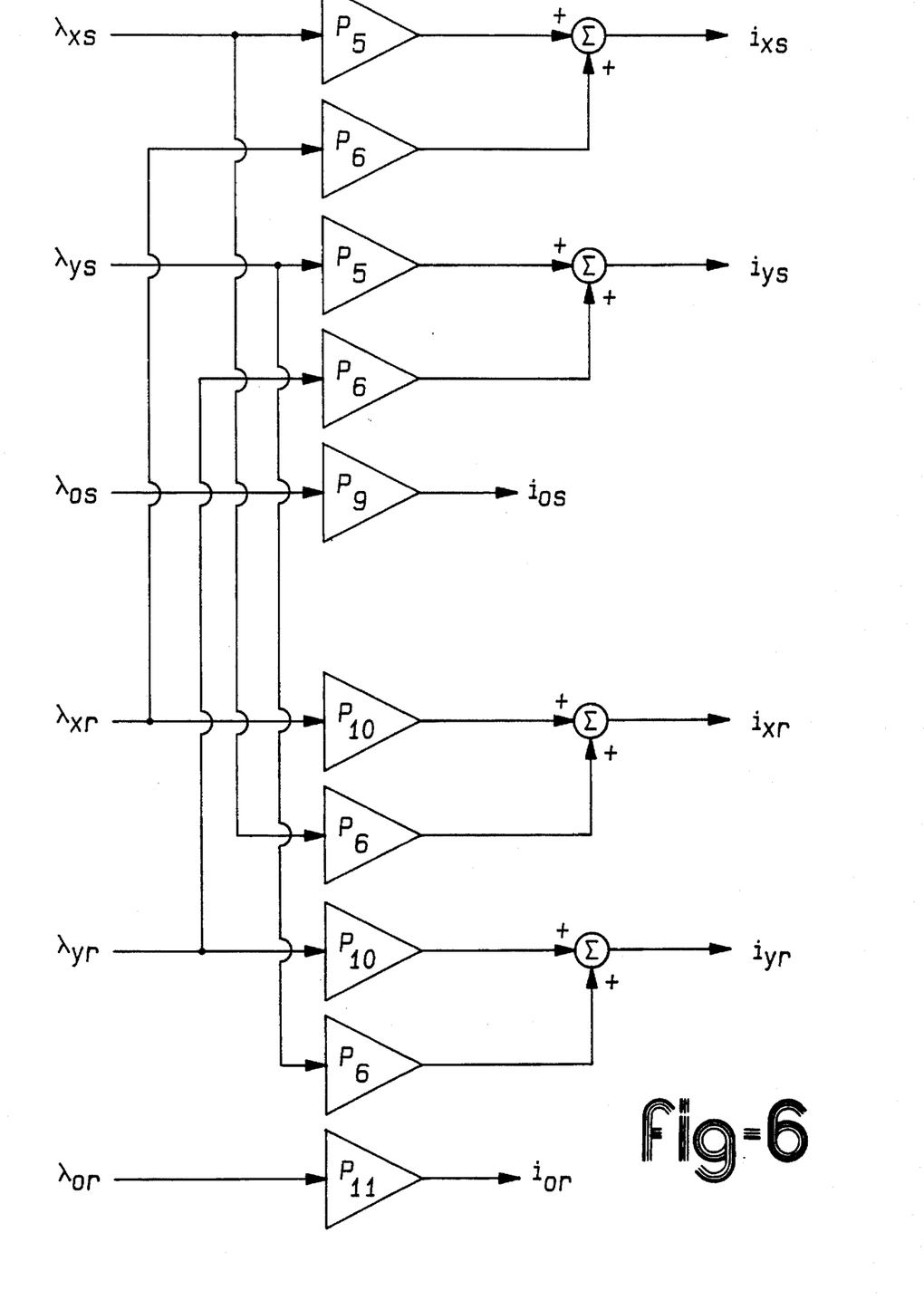
Figure 7:
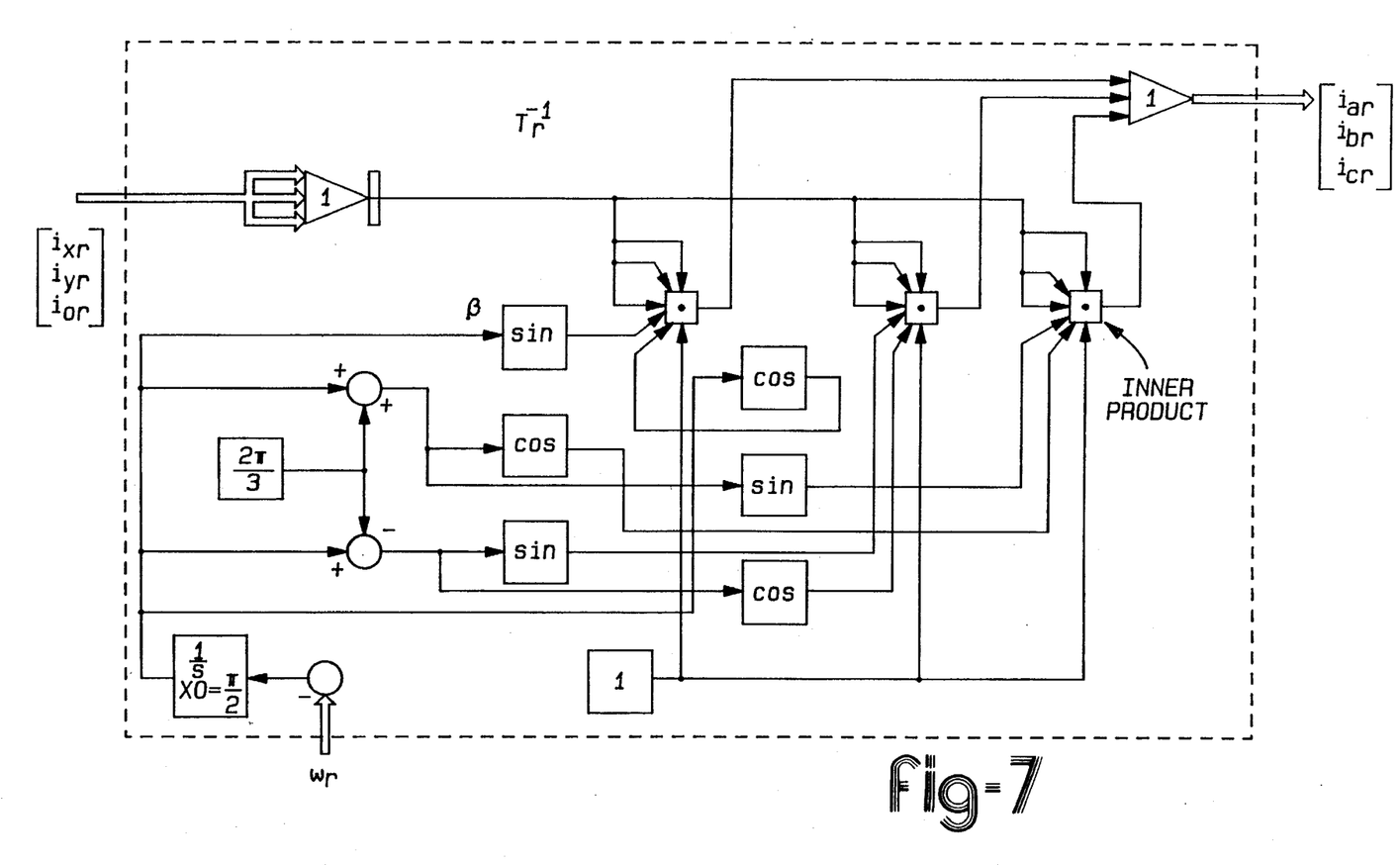
Figure 8:
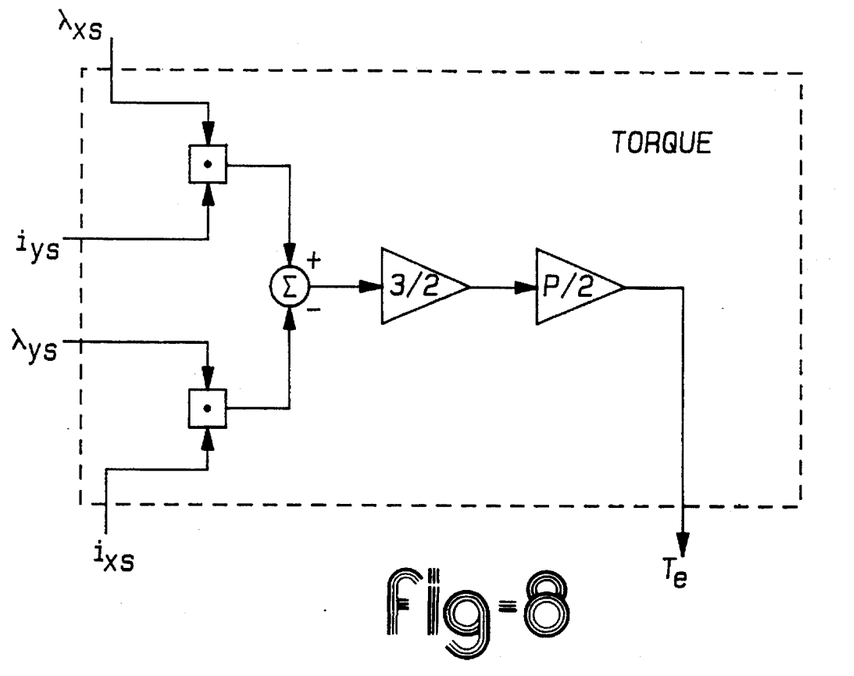
Figure 9:
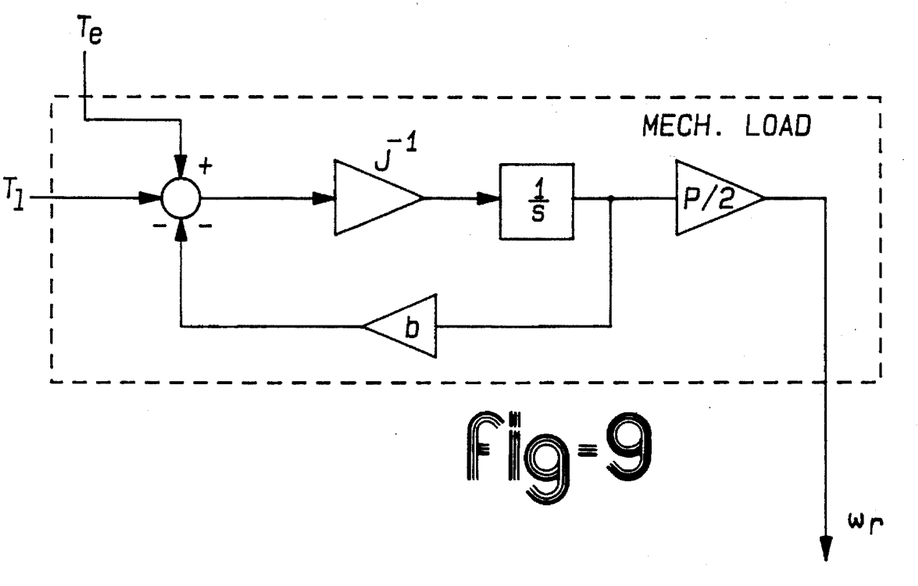

With reference to FIGS. 3 and 4 of the drawings, there are provided simple block schematics of the induction machine model-which are based on the modified equations in x-y reference frame provided above.

As indicated above, the disclosed invention describes a modeling technique for simulating the behavior and operation of a three-phase induction machine operative for all types of inputs and loads. FIG. 4 is the machine model in "super-block" form. The $T_S$ super-block, for example, translates the three-phase voltage applied to the stator in x-y axes reference frame. Similarly, "λ" corresponds to the fluxes in the motor and outputs six different flux values in x-y reference frame in response to the applied voltages in x-y frame and the speed $\omega_r$ of the motor. Still further, "I"

synthesizes the stator and rotor winding currents in x-y frame from various fluxes in x-y frame.

"$T_S^{-1}$" and "$R_r^{-1}$" respectively provide the inverse from the x-y reference frame to actual values for the stator current and rotor current. Still further, "Torque" constructs the signal corresponding to the generated torque from the fluxes and currents in x-y reference frame. Lastly, "Mechanical Load" creates the speed $\omega_r$ of the motor using the generated torque and load torque. This is the model of the mechanical load under use in a specific application.

Detailed block diagrams showing the components of the super-blocks referenced in FIGS. 3 and 4 are given in FIGS. 5–9.

As shown in FIG. 3, a first plurality of input signals 44 corresponding to the phase voltages are shown input to first super-block 46 ($T_S$). $T_S$ is a 3×3 matrix with constants. In this super-block, the first plurality of input voltages are translated from stator and rotor machine values (actual values) to corresponding x-y-o variables. A second plurality of input signals 48 are thereafter generated which, in turn, correspond to the translated first plurality of input signals. Second plurality of digital signals 48 are fed to super-block 50 wherein the flux linkages, current and torque equations are applied to process the input signals so as to determine three-phase stator currents ($i_{xyos}$), rotor currents ($i_{xyor}$) and generated load torque ($T_e$).

These stator and rotor currents in x-y axes are corresponding first and second plurality of digital input signals for super-blocks 52 ($T_S^{-1}$) and 54 ($T_R^{-1}$). In super-blocks 52 and 54, the respective stator and rotor currents in x-y variables are translated, respectively, to actual (machine) values.

With reference to super-block 56 (Mechanical Load), it is recognized that the generated torque and load torque are used to determine the motor speed which is, of course, one of the inputs to super-block 50.

Turning now to FIGS. 5–9, a more detailed diagram of the super-blocks of the induction machine model of the present invention will be described. As shown, a plurality of blocks and super-blocks are connected with signals as in physical systems. Applicants have found this to be a very convenient way for the simulation task. In operation, the super-blocks of various subsystems of vehicle components such as drivetrains, for example, may be connected "on screen" and simulated based upon various inputs and loads.

The super-block illustrated in FIG. 4 includes $T_S$ block 76 which, as indicated above, translates the three-phase voltage inputs applied to the stator from machine (actual) values to x-y axis reference frame. Similarly, $\lambda$ referenced in block 78 uses the applied voltages in x-y frame and the speed $\omega_r$ of the motor to output six different flux values in x-y reference frame. Still further, "I" block 80 synthesizes stator and rotor winding currents in x-y frame from various fluxes in x-y frame.

Still referring to FIG. 4, it is shown that $T_S^{-1}$ and $T_r^{-1}$, blocks 82 and 84, respectively, provide the inverse from the x-y reference frame to actual values for the stator currents and rotor currents. Finally, generated torque and mechanical load are modeled and determined as shown in blocks 86 and 88.

Each of the "super-blocks" comprises various blocks to perform interim functions and calculations. These blocks include, for example, integrators, gains, multipliers, sine functions, etc. In accordance with the present invention, the "super-blocks" referenced above (e.g., $\lambda$, I, $T_r^{-1}$, etc.) are provided in FIGS. 5–9 based upon the modified equations in x-y frame referenced above which describe the machine.

In keeping with the invention, it is understood that the modeling approach referenced above is valid for any three-phase voltage inputs and load torque, varying in any form. The output of the present invention provides both transient and steady-state data. Also, the modeling approach is valid for induction motor as well as induction generator operation such as in regenerative braking in electric vehicles. The present invention may also be used for fault conditions, e.g., three-phase short-circuit fault and one-phase open fault.

The block diagram approach of the present invention overcomes the difficulties of prior art approaches and obviates the need for writing complex programs to solve non-linear differential and algebraic equations for off-line computer simulation. In accordance with the invention, the block diagram approach referenced herein describes the model in "super-blocks" which consist of simple building blocks connected appropriately. The preferred mode block diagram approach leads to easier and faster development because of modularity. For example, systems may be easily connected such as connecting physical systems, whereas in prior art programming approaches, connecting to systems requires the merger and analysis of complex codes and variables which is both inconvenient and difficult. Indeed, those skilled in the art will recognize that the development process with a programming language is expansive, requiring the use of numerous variables and attendant labor. In contrast, the block diagram approach of the present invention is easier to understand and follow.

E. Real-Time Digital Simulating Device

Figure 2:
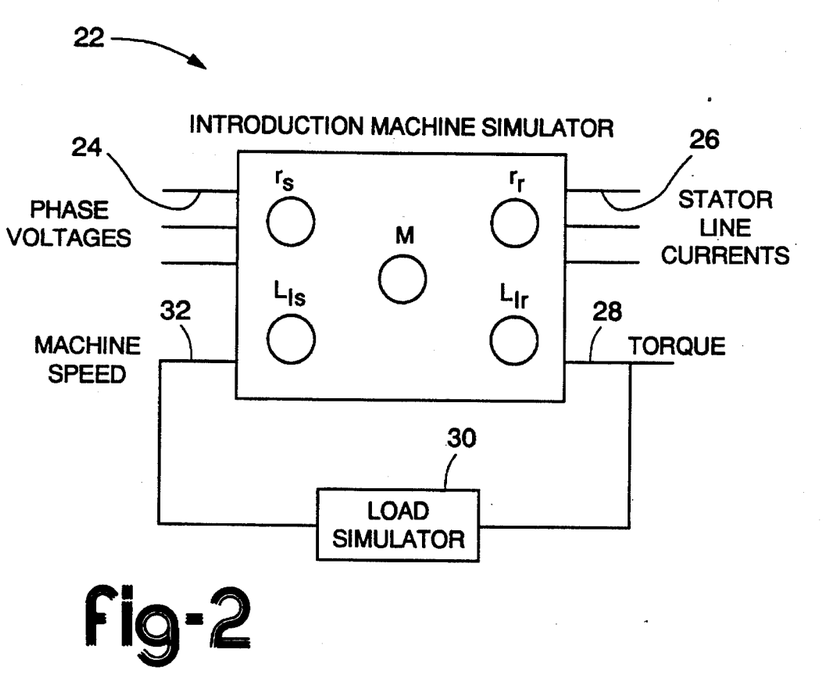
FIG. 2 is a schematic block diagram of the induction machine simulator of the present invention showing inputs, outputs and the front panel.

With reference to FIG. 2 of the drawings, a DSP-based implementation of the simulator of the present invention will now be described. As shown in FIG. 2, the induction machine simulator, generally designated by reference numeral 22, is shown including user-selected input parameters including stator resistance ($r_s$), rotor resistance ($r_r$), stator leakage inductance ($L_{ls}$), rotor leakage inductance ($L_{lr}$) and mutual inductance (M). There is further shown analog phase voltages 24 and machine speed 32, input to induction machine simulator 22, and stator line currents 26 output therefrom. Still further, there is shown generated torque output 28 which is fed to a corresponding load simulator 30 which is used to determine motor speed 33.

1. Simplified Circuit Schematic

With reference to FIGS. 2 and 10 of the drawings, the hardware of the induction machine simulator 22 will now be described in further detail. As shown in FIG. 10, the hardware of simulator 22 includes a computer bus 32, a central processing unit (CPU) 34, and a plurality of memory devices which may include a random access memory (RAM) 36 for temporary storage during computations and read-only memory (ROM) 38 used to store the simulator program. CPU 34, RAM 36, and ROM 38 are all in electrical contact with common computer bus 32.

Applicants note that the simulator apparatus disclosed herein is based on a fast DSP or of high word length and with floating point capability.

Still referring to FIGS. 2 and 10 of the drawings, it is seen that analog-to-digital converters generally designated by reference numeral 40 are included for converting the analog inputs of the phase voltages, motor speed and input parameters to digital equivalents—prior to translation to x-y-o variables and processing by the CPU. FIG. 10 illustrates the use of a front panel and a plurality of digital interfaces in order to specify the input parameters. The front panel includes a plurality of potentiometers in electrical contact with A/D converters 40 and digital wheels in electrical contact with the digital interfaces. The front panel is used to specify stator resistance ($r_s$), rotor resistance ($r_r$), mutual inductance (M), stator leakage inductance ($L_{ls}$) and rotor inductance ($L_{lr}$).

Understandably, digital-to-analog converters are also necessary subsequent to processing in order to output machine a-b-c (actual) values such as stator current outputs $i_{abcs}$, and generated torque $T_e$. These digital-to-analog converters are designated generally by reference numeral 42. To keep accuracy as high as possible, applicants have found that it is desirable to select high performance A/D and D/A converters with conversion time on the order of one microsecond.

2. Method Of Solving The Equations For The Simulator

With reference to FIG. 11 of the drawings, the method of solving the applicable simulator equations will now be described in further detail. At the threshold, it should be understood that the disclosed real-time simulator based on a DSP has a few challenging requirements. For instance, the simulator must produce outputs (currents and torque) in real time as the voltage inputs are applied and the parameters are varied in continuous time. Thus, all computations must be completed very quickly. In addition, it is essential for the outputs to be accurate locally and globally, i.e. over short intervals and over long periods of time.

In the digital real time simulation disclosed, the equations of the machine must be solved repetitively with the selected sampling period $\Delta t$. In order to ensure the required accuracy, the following steps are taken in accordance with the invention:

(a) A new set of modified equations are obtained which minimize the required arithmetic operations. These equations are in stationary 2-axis frame (x-y axes);

(b) A powerful processor is selected, for example, a 32-bit DSP with floating point calculation capability;

(c) High performance A/D and D/A converters are utilized because of their short conversion time and accuracy;

(d) A fourth-order Runge-Kutta Method of integration is utilized; and (e) A small sampling period ($\Delta t$) of the order of 10 micro-seconds is selected.

The computational procedure may now be described with reference to the differential (dynamic) equations from the modified set of equations in x-y frame which are repeated below:

$$p\lambda_{xs} = v_{xs} + p_1\lambda_{xs} + p_2\lambda_{xr}$$

$$p\lambda_{ys} = v_{ys} + p_1\lambda_{ys} + p_2\lambda_{yr}$$

$$p\lambda_{os} = v_{os} + p_7\lambda_{os}$$

$$p\lambda_{xr} = p_3\lambda_{xr} + p_4\lambda_{xs} - \omega_r\lambda_{yr}$$

$$p\lambda_{yr} = p_3\lambda_{yr} + p_4\lambda_{ys} + \omega_r\lambda_{xr}$$

For the convenience of description, a unified terminology may be adopted to define the state vector x and the vector of all other variables appearing in the right hand side of the differential equations u.

$$\underline{x} \triangleq \begin{bmatrix} \lambda_{xs} \\ \lambda_{ys} \\ \lambda_{os} \\ \lambda_{xr} \\ \lambda_{yr} \end{bmatrix} = \begin{bmatrix} x_1 \\ x_2 \\ x_3 \\ x_4 \\ x_5 \end{bmatrix}$$

$$\underline{u} \triangleq \begin{bmatrix} v_{xs} \\ v_{ys} \\ v_{os} \\ \omega_r \end{bmatrix}$$

Solving the dynamic equations means obtaining the values of the states X at $t=(n+1)\Delta t$ with the knowledge of $\underline{x}$ and at u $t=n\Delta t$. We denote values of $\underline{x}$ and $\underline{u}$ at $t=n\Delta t$ as $\underline{x}_n$ and $\underline{u}_n$, respectively, and the value of x at $t=(n+1)\Delta t$ as $\underline{x}_{n+1}$. To arrive at the proper solution, the first step is to substitute $\underline{u}=\underline{u}_n$ in the equations and write the same as:

$$px_1 = f_1(x)$$

$$px_2 = f_2(x)$$

$$px_3 = f_3(x)$$

$$px_4 = f_4(x)$$

$$px_5 = f_5(x)$$

or, in brief, $$px_i = f_i(x) \quad (i=1,2,\ldots,5).$$

The selected fourth order Range-Kutta integration method for these simultaneous first order differential equations will yield:

$$x_i(n+1) = x_i(n) + 1/6 [K_{1,i} + 2K_{2,i} + 2K_{3,i} + K_{4,i}]$$

$$(i = 1,2,\ldots,5)$$

where the intermediate variables for calculations, $K_{j,i}$ are expressed as:

$$K_{j,i} = \Delta T f_i (\underline{x}_n + \underline{\alpha}_j) \quad \begin{pmatrix} i = 1,2,\ldots 5 \\ j = 1,2,3,4 \end{pmatrix}$$

where vector $\alpha$ is independent of i and expressed as:

$$\underline{\alpha}_1 = \begin{bmatrix} 0 \\ 0 \\ 0 \\ 0 \\ 0 \end{bmatrix}; \underline{\alpha}_2 = \frac{1}{2} \begin{bmatrix} K_{1,1} \\ K_{1,2} \\ K_{1,3} \\ K_{1,4} \\ K_{1,5} \end{bmatrix};$$

$$\underline{\alpha}_3 = \frac{1}{2} \begin{bmatrix} K_{2,1} \\ K_{2,2} \\ K_{2,3} \\ K_{2,4} \\ K_{2,5} \end{bmatrix}; \underline{\alpha}_4 = \begin{bmatrix} K_{3,1} \\ K_{3,2} \\ K_{3,3} \\ K_{3,4} \\ K_{3,5} \end{bmatrix}$$

The sequence of computations for $K_{j,i}$ is $K_{1,1}$, $K_{1,2}$, $K_{1,3}$, $K_{1,4}$, $K_{1,5}$, $K_{2,1}$, $K_{2,2}$, ... etc. In other words, for a given value of j, calculations are done for all i in the order 1,2,3,4,5 and then repeated for next higher j. See, for example, K. S. Kunz, "Numerical Analysis" McGraw Hill, 1957.

Thus, following the stated procedure, $\lambda_{xs}$, $\lambda_{ys}$, $\lambda_{os}$, $\lambda_{xr}$, and $\lambda_{yr}$ are obtained at the next sampling instant, given all variables at the current sampling instant. The remaining equations of the modified set of machine equations in x-y frame are algebraic and are reproduced below:

$$i_{xs} = p_5\lambda_{xs} + p_6\lambda_{xr}$$

$$i_{ys} = p_5\lambda_{ys} + p_6\lambda_{yr}$$

$i_{os} = p_9 \lambda_{os}$, and, $$T_e = \frac{3P}{4} (\lambda_{xs}i_{ys} - \lambda_{ys}i_{xs})$$

Thus, given states at any sampling instant, $i_{xs}$, $i_{ys}$, $i_{os}$, and $T_e$ can be obtained at the same instant by simple arithmetic operations utilizing the above equations.

While the best mode for carrying out the invention has been described in detail, those familiar with the art to which this invention relates will recognize various alternative designs and embodiments for practicing the invention as defined by the following claims.

We claim:

1. For use in cooperation with a load simulator operative to generate an analog machine speed signal in response to a received simulated torque, an apparatus for simulating off-line and in real-time the behavior and operation of a 3-phase induction machine in accordance with input analog stator phase voltages and user-selected inductance machine parameters, the apparatus comprising:

a computer bus;

specification means in electrical contact with said computer bus for specifying said user selected inductance machine parameters to generate a first plurality of digital input signals corresponding thereto;

first converter means in electrical contact with said computer bus and said load simulator for converting said analog machine speed signal and said input analog stator phase voltages to digital signals to generate a second plurality of digital input signals corresponding thereto;

first storage means in electrical contact with said computer bus for storing a simulator program adapted to recursively solve a selected set of mathematical equations corresponding to the behavior of said 3-phase induction machine;

processing means in electrical contact with said computer bus for executing said program using said first and second plurality of digital input signals to generate a plurality of digital output signals simulating stator currents drawn by said 3-phase induction machine and simulating a torque of said induction machine; and second converter means in electrical contact with said computer bus for converting said plurality of digital output signals simulating said stator currents and said torque to generate analog output signals corresponding to said simulated stator currents and said simulated torque, said analog output signals simulating said torque being applied to said load simulator to generate said analog machine speed signal.

2. Apparatus as in claim 1, further including second storage means in electrical contact with said computer bus for storing selected interim calculations performed by said processing means.

3. An apparatus as in claim 1, wherein said specification means comprises:

a plurality of A/D converters;

a plurality of digital interfaces;

a panel having a plurality of potentiometers in electrical contact with said plurality of A/D converters and digital wheels in electrical contact with said plurality of digital interfaces, wherein said panel may be used to specify stator resistance ($r_s$), rotor resistance ($r_r$), mutual inductance (M), stator leakage inductance ($L_{ls}$) and rotor inductance ($L_{lr}$).

4. Apparatus as in claim 3, wherein said processing means is a fast high word length, high speed digital signal processor (DSP) with floating point capability.

5. Apparatus as in claim 1, wherein said processing means is a Central Processing Unit (CPU).

6. Apparatus as in claim 1, wherein said first converter means comprise a plurality of A/D converters.

7. Apparatus as in claim 1, wherein said second converter means comprise a plurality of D/A converters.

8. Apparatus as in claim 1, wherein said program is adapted to solve said selected set of mathematical equations in accordance with the 4th order Runge-Kutta integration method.

9. Apparatus as in claim 1, wherein said program is further adapted to solve said selected set of mathematical equations utilizing stationary x-y axes transformations.

* * * * *